United States Patent
Maurelli

(10) Patent No.: US 7,910,978 B2
(45) Date of Patent: Mar. 22, 2011

(54) PROCESS FOR MANUFACTURING A MEMORY DEVICE INTEGRATED ON A SEMICONDUCTOR SUBSTRATE AND COMPRISING NANOCRYSTAL MEMORY CELLS AND CMOS TRANSISTORS

(75) Inventor: Alfonso Maurelli, Sulbiate (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 260 days.

(21) Appl. No.: 12/129,014

(22) Filed: May 29, 2008

(65) Prior Publication Data
US 2008/0296658 A1  Dec. 4, 2008

(30) Foreign Application Priority Data
Jun. 4, 2007  (IT) ............... MI2007A1140

(51) Int. Cl.
*H01L 29/788* (2006.01)
*H01L 21/336* (2006.01)
(52) U.S. Cl. ......... 257/321; 257/E29.129; 257/E21.422; 438/257
(58) Field of Classification Search .......... 257/321; 438/257
See application file for complete search history.

(56) References Cited

U.S. PATENT DOCUMENTS

| | | | |
|---|---|---|---|
| 5,576,573 A * | 11/1996 | Su et al. ............ 257/391 |
| 5,714,766 A | 2/1998 | Chen et al. |
| 6,784,103 B1 | 8/2004 | Rao et al. |
| 6,958,265 B2 | 10/2005 | Steimle et al. |
| 7,012,297 B2 * | 3/2006 | Bhattacharyya ....... 257/317 |
| 2004/0232478 A1 | 11/2004 | Kim et al. |
| 2006/0046384 A1 | 3/2006 | Joo et al. |

* cited by examiner

*Primary Examiner* — W. David Coleman
(74) *Attorney, Agent, or Firm* — Lisa K. Jorgenson; Kevin D. Jablonski; Graybeal Jackson LLP

(57) ABSTRACT

An embodiment of a process is disclosed herein for fabricating a memory device integrated on a semiconductor substrate and comprising at least a nanocrystal memory cell and CMOS transistors respectively formed in a memory area and in a circuitry area. According to an embodiment, a process includes forming a nitride layer having an initial thickness, placed above a nanocrystal layer, in the memory area and the formation in the circuitry area of at least one submicron gate oxide. The process also provides that the initial thickness is such as to allow a complete transformation of the nitride layer into an oxide layer at upon formation of said at least one submicron gate oxide.

36 Claims, 4 Drawing Sheets

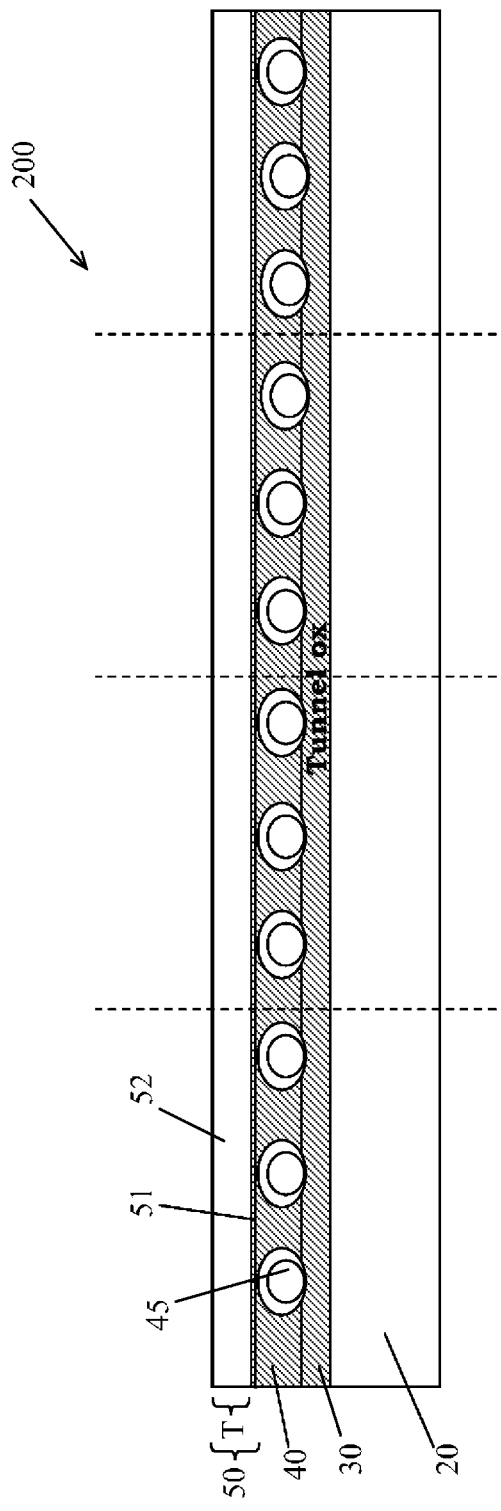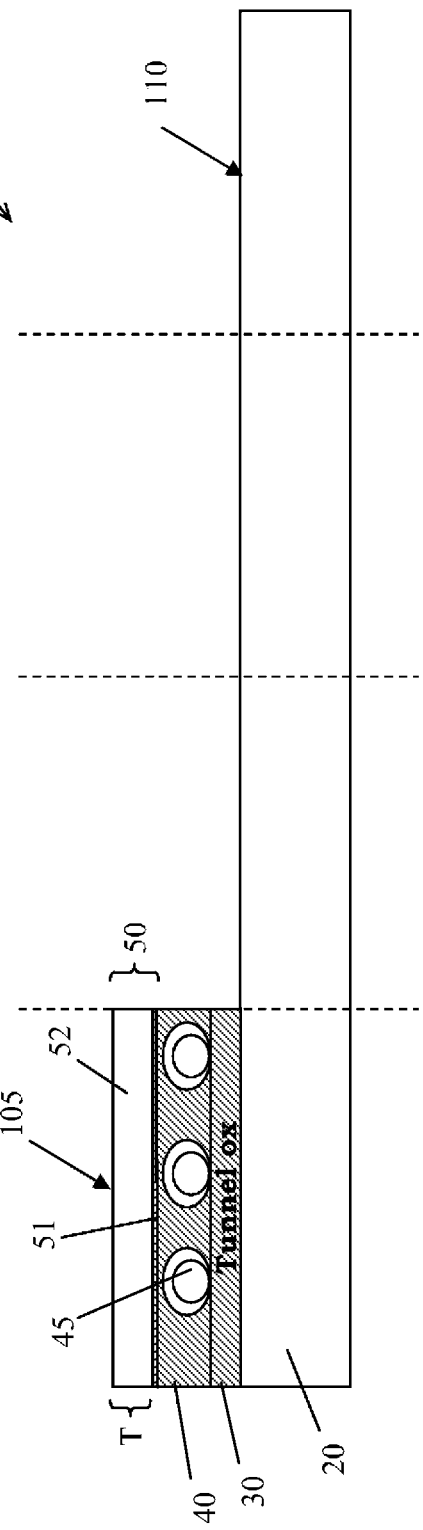

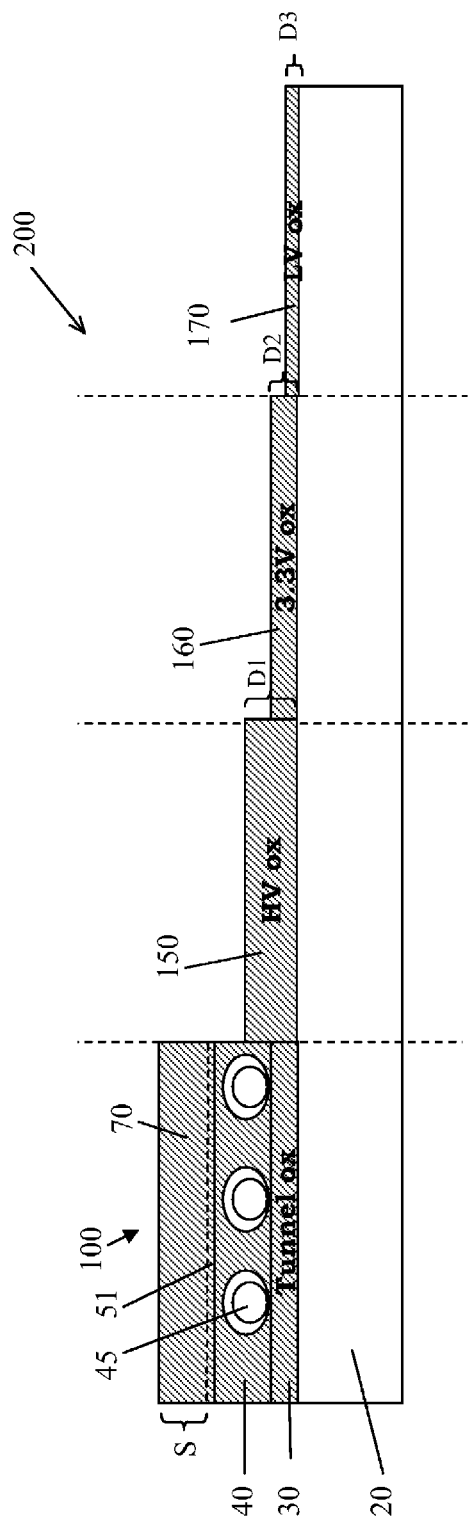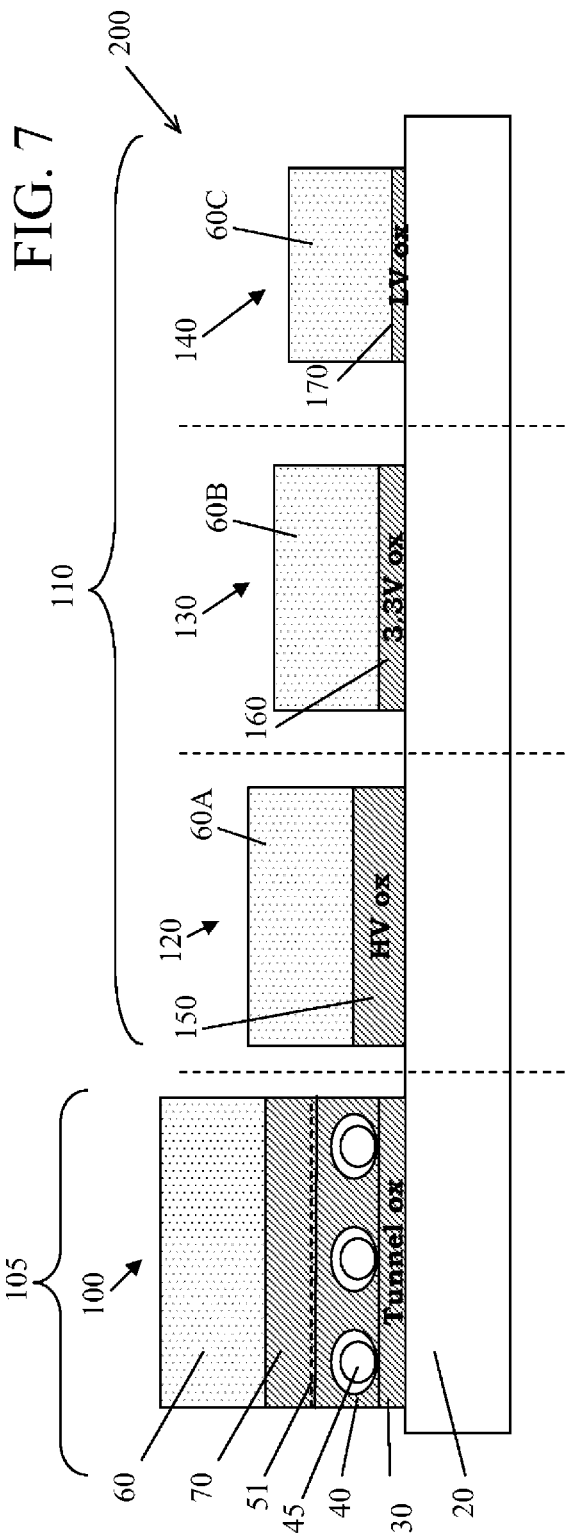
FIG. 7
FIG. 8

PROCESS FOR MANUFACTURING A MEMORY DEVICE INTEGRATED ON A SEMICONDUCTOR SUBSTRATE AND COMPRISING NANOCRYSTAL MEMORY CELLS AND CMOS TRANSISTORS

CLAIM OF PRIORITY

This application claims priority from Italian patent application No. MI 2007A 001140, filed on Jun. 4, 2007, which is incorporated herein by this reference.

TECHNICAL FIELD

An embodiment of the present invention relates to a process for fabricating a memory device integrated on a semiconductor substrate and comprising nanocrystal memory cells and CMOS transistors. More specifically, an embodiment of the invention relates to a process, which includes a first step suitable for forming above a semiconductor substrate a first dielectric layer; a second step suitable for forming above said first dielectric layer a layer of nanocrystals comprising a plurality of nanocrystals; a third step suitable for forming above said layer of nanocrystals a second dielectric layer; a fourth masking and etching step suitable for removing the second dielectric layer, the layer of nanocrystals and the first dielectric layer to form on the semiconductor substrate a nanocrystal memory area and a circuitry area of said memory device; and a fifth oxidation step suitable for forming on the circuitry area at least one gate oxide for at least one of the CMOS transistors of said memory device. An embodiment of the present invention also relates to a semiconductor-integrated memory device comprising nanocrystal memory cells and CMOS transistors.

BACKGROUND

In recent years, semiconductor devices have been characterized by continuous reductions of their overall dimensions as well as a continuous increase of the integration density of elemental transistor structures comprised in these devices.

At present, there is the need for fabricating memory devices on semiconductors having submicron dimensions integrating non-volatile memory cells (e.g., floating gate cells) with circuitry comprising elemental transistor structures of the CMOS type.

While completely submicron elemental transistor structures of the CMOS type are currently available, there is still a need for suitably designed memory cells having reduced dimensions.

A traditional floating gate memory cell is schematically shown in FIG. 1 and globally indicated with 1. In the traditional concept, the memory cell 1, also called double-poly, is formed above a silicon substrate 2. The memory cell 1 includes a first dielectric layer, which, by way of convention and similarity with similar memory cells is also called tunnel layer, and a polysilicon layer 3 formed thereover. The memory cell 1 further includes a polysilicon layer 5 formed over the polysilicon layer 3, with a further dielectric layer 4 formed therebetween.

In particular, in the double-poly memory cell 1, the first polysilicon layer 3 defines a floating gate of the cell and, during the operation, allows storing electric charges suitable for defining the state of the memory cell 1 (i.e., a logic state 0 or 1).

However, during the integration process with submicron CMOS transistors, the double-poly memory cells 1 show some drawbacks.

On one hand, there is sometimes a need for creating memory cells with submicron dimensions, which clashes with the current dimensions of the double-poly memory cells that have reached their physical minimum although remaining too large for submicron applications.

On the other hand, there is sometimes a need to integrate the current fabrication processes of the memory cells with the fabrication processes of the submicron CMOS transistors.

A known solution suitable for reducing the dimensions of the memory cells includes the introduction in the memory cell itself of nanocrystals to form a so-called nanocrystal memory cell.

In particular, in these nanocrystal memory cells, the nanocrystals store electric charges similarly to the floating gate of the double-poly memory cells. In these nanocrystal memory cells, a layer comprising a plurality of nanocrystals is substituted for one of the polysilicon layers.

A prior art solution for fabricating nanocrystal memory cells is described, for example, in U.S. Patent Application Publication 2004/0232478 ("the '478 Application"), which is incorporated herein by this reference. The '478 Application describes how, above a substrate, first and second silicon oxide layers are formed, each containing a plurality of nanocrystals. These oxide layers are alternated by an intermediate dielectric layer, such as a nitride layer.

Such processes of forming memory cells, although meeting the need of reducing the physical dimensions of the memory cells, show some drawbacks.

In particular, the nitride layer present in the memory cells made for the specific physical characteristics can act, in turn, as a trap of electric charges that can function as a further floating gate for the memory cell.

Moreover, during the integration process with submicron CMOS transistors, the oxidations successive to the deposition of the nitride layer can, in some implementations, alter the thickness of the nitride layer. The altered thickness of the nitride layer sometimes cannot be controlled with accuracy and, thus, may be a source of error during the operation of the memory device so-formed. In particular, the nitride layer may generate errors during the storage of the electric charges in the memory cells, under the programming step of the cells themselves, and during the reading of the charges contained and thus of the effective state of these cells.

Further solutions of nanocrystal memory cells have been proposed and shown by way of example in U.S. Pat. No. 5,714,766 and in U.S. Pat. No. 6,784,103, each of which is incorporated herein by this reference. These patents describe how the nanocrystals are incorporated in a semiconductor layer formed between two oxide layers, such as silicon oxide layers.

A further nanocrystal memory cell is shown in the U.S. Patent Application Publication No. US 2006/0046384 ("the '384 Application"), which is incorporated herein by this reference. The '384 Application discloses a plurality of nanocrystals incorporated in a dielectric layer defining a control gate and located above a tunnel dielectric layer.

Although the nanocrystal memory cells so-formed allow the dimensions of the memory cells to be reduced and avoid using a nitride layer, such nanocrystal memory cells may still show some drawbacks during the processes of integration with CMOS transistors for forming memory devices (i.e., high complexity devices).

In particular, in these high-complexity memory devices, the nanocrystal memory cells are integrated with ultra-submicron CMOS transistors.

As is known, the relative integration processes provide the differentiation of the gate oxides of the submicron CMOS transistors by subjecting the substrate to repeated thermal treatments at high temperatures, such as by employing the In Situ Steam Generation technique ("ISSG").

Unfortunately, exposing nanocrystals present in the memory cells to high temperatures tends to cause the nanocrystals to arrange themselves in a random, anomalous way that causes irregularities and anomalies. Such irregularities and anomalies may compromise the technical characteristics of the nanocrystals memory cells so-formed and, consequently, deteriorate the performance of the memory device as a whole.

U.S. Pat. No. 6,958,265, which is incorporated herein by this reference, proposes to form semiconductor devices with nanocrystal memory cells by employing an oxidizing barrier layer above the nanocrystals for inhibiting the oxidation of the nanocrystals during the integration process of the device, such as in particular during the thermal treatments used for the forming the gate oxides.

However, this process may form, by means of a specific steam oxidation step, thick gate oxides for the CMOS transistors contained in the device and to partially oxidize a corresponding barrier layer. Therefore, it may be necessary to provide a final removal step of this barrier layer.

SUMMARY

An embodiment of the invention provides a process for the forming a memory device integrated on a semiconductor that may allow, in a simple and desirable manner, integration of nanocrystal memory cells with CMOS transistors of the submicron type. An embodiment of the present invention may also provide a suitable protective layer that shelters nanocrystals of memory cells in different process steps during the fabrication of a memory device, such as during thermal treatments used in fabricating the CMOS transistors contained in this device.

In an embodiment of a method of the present invention, the method includes: (1) a first step suitable for forming, above a substrate, a first dielectric layer; (2) a second step suitable for forming, above the first dielectric layer, a nanocrystal layer comprising a plurality of nanocrystals; (3) a third step suitable for forming, above the nanocrystal layer, a second dielectric layer; (4) a fourth masking and etching step suitable for removing the second dielectric layer, the nanocrystal layer and the first dielectric layer to define, on the substrate, a nanocrystal memory area, and a circuitry area; and (5) a fifth oxidizing step suitable for forming on the circuitry area at least one gate oxide for at least one of said CMOS transistors. The third step further comprises at least one controlled deposition step suitable for defining at least one nitride layer having an initial thickness, the initial thickness being such as to allow a complete conversion of said nitride layer into an oxide layer at the end of the fifth oxidizing step to form the second dielectric layer.

BRIEF DESCRIPTION OF THE DRAWINGS

Characteristics and advantages of a process for fabricating a memory device according to one or more embodiments of the invention will be apparent from the following description given by way of an indicative and non-limiting example with reference to the drawings.

FIGS. 3-8 show various stages in a method of fabricating a semiconductor-integrated memory device according to an embodiment of the present invention.

DETAILED DESCRIPTION

Figure 2:
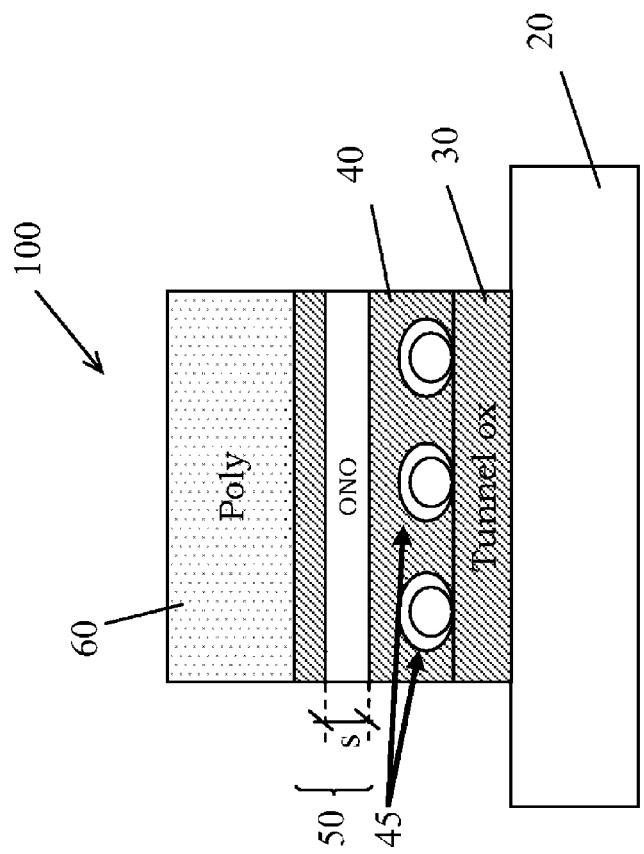
FIG. 2 schematically shows a section of a nanocrystal memory cell fabricated according to an embodiment of the present invention.
Figure 1:
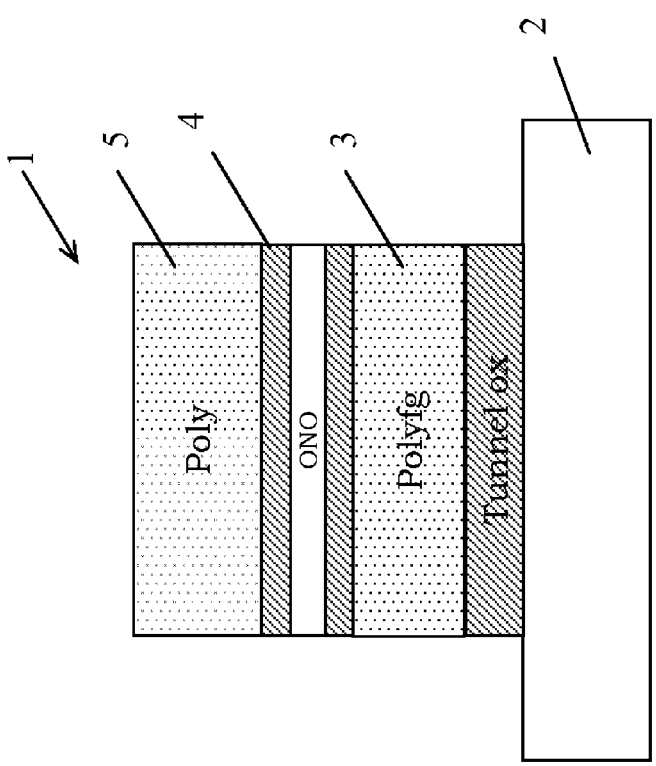
FIG. 1 schematically shows a section of a conventional memory cell.

With reference to these figures, and in particular to the example of FIG. 8, a section enlarged view of an embodiment of a semiconductor-integrated memory device 200 is schematically shown.

Referring to FIG. 8, the memory device 200 comprises at least one nanocrystal memory cell 100 in a memory area 105, and a plurality of CMOS transistors 120, 130, 140 formed in a circuitry area 110. The CMOS transistors 120, 130, 140 define a control circuitry for the nanocrystal memory cell 100.

In the present embodiment, the memory device 200 may perform logical functions and in this case the circuitry may include CMOS transistors tailored for performing these logical functions.

In particular, in the present embodiment, given by way of indicative and non-limiting example, the circuitry area 110, placed next to the memory area 105, includes a first transistor 120, a second transistor 130 and a third transistor 140, which have respectively three different gate oxide thicknesses 150, 160, 170 designed for different functions. The considerations made hereafter can be extended to any number of nanocrystal memory cells and of circuitry transistors present in the memory device, as well as to transistors having different shapes with respect to those shown by way of indication.

The process steps and the structures described hereafter for the fabricating the memory device 200 may not form a complete process flow. The described one or more embodiments of present invention can be practiced together with the manufacturing techniques of integrated circuits currently used in the field. Only those process steps being necessary for the comprehension are included hereafter.

Moreover, the figures showing schematic views of portions of the device integrated during its manufacturing are not drawn to scale.

With reference to the annexed figures and in particular to FIGS. 3-8, hereafter the process steps according to an embodiment of the invention for fabricating the memory device 200 will be described.

Following some standard steps of a process for fabricating a memory device, starting from a semiconductor substrate 20, suitable regions and areas suitable for the formation of memory cells are formed according to the design specifications.

These steps will not be described hereafter since they are not important.

Referring to FIG. 3, according to an embodiment of the present invention, the process provides, in particular, a first step suitable for forming, above the substrate 20, a first dielectric layer 30. The first dielectric layer 30, by convention and similarity with similar memory cells, is also called tunnel layer.

In particular, the first dielectric layer or tunnel layer 30 is an oxide and the first step can provide a growth of the oxide or a deposition thereof.

The process then provides a second step suitable for forming, above the tunnel layer 30, a nanocrystal layer 40 comprising a plurality of nanocrystals 45.

The formation of the plurality of nanocrystals 45 can occur through deposition according to any method of the known type or through growth according to a traditional process in oven or by means of an epitaxial process.

Further, the process comprises a third step suitable for forming, above the nanocrystal layer 40, a second dielectric layer 50.

According to the present embodiment, the third step of the process provides a deposition step of a thin oxide layer 51, above the nanocrystal layer 40.

The third step also provides at least one controlled deposition step suitable for defining at least one nitride layer 52 having an initial thickness T.

In this way, the second dielectric layer 50 comprises a thin oxide layer 51, shown in FIG. 3, covered by the nitride layer 52.

The initial thickness T of the nitride layer 52 of the second dielectric layer 50 is a function of the thickness of the gate oxides 150, 160, 170, which will be grown in correspondence with the circuitry area 110, as it will be better described hereafter.

Referring to FIG. 4, the process then provides a fourth masking and etching step suitable for removing a portion of the second dielectric layer 50, the nanocrystal layer 40, and the first dielectric layer 30 to form, on the substrate 20, the nanocrystal memory area 105 that is suitable for comprising the nanocrystal memory cells 100, and the circuitry area 110 that is suitable for comprising the control CMOS transistors.

Figure 5:
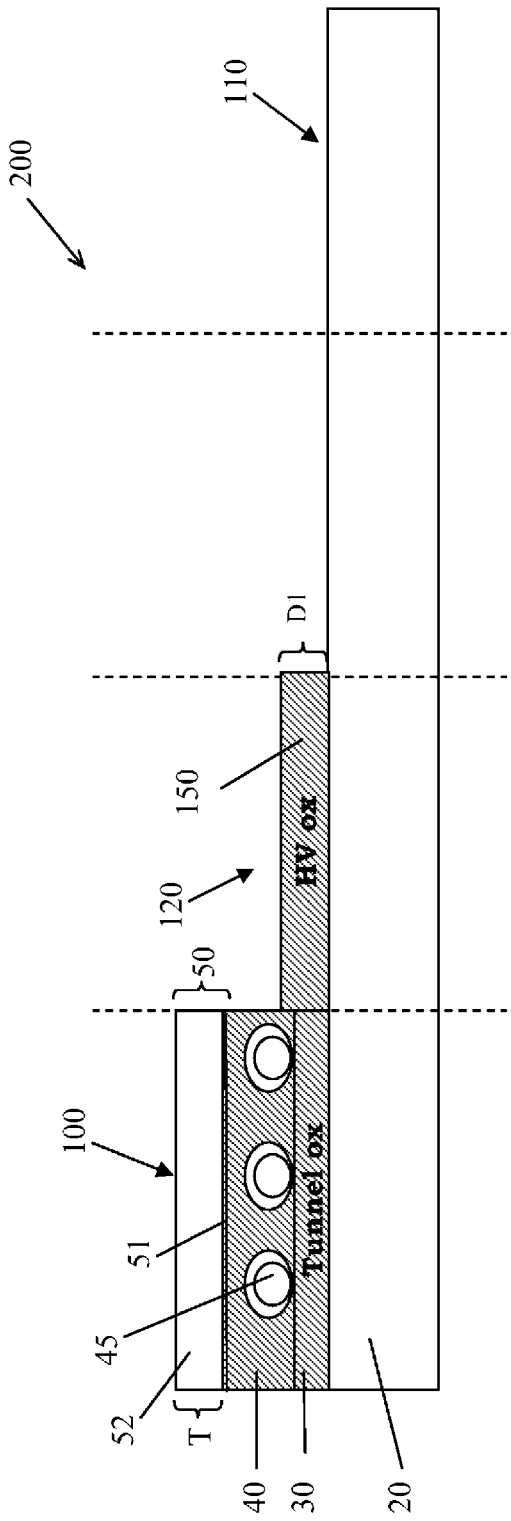

Referring to FIG. 5, according to the present embodiment, the process then provides a fifth oxidizing step suitable to form, on the circuitry area 110, at least one gate oxide 150, 160, 170 for at least one corresponding CMOS transistor.

Still referring to FIG. 5, according to the present embodiment, the fifth oxidizing step provides at least one preliminary sub-step suitable for forming a preliminary gate oxide 150 for the respective first transistor 120. Even more particularly, the first transistor 120 is a transistor of the high-voltage type and the preliminary gate oxide 150 has a first high thickness D1, for example such as to allow the first transistor 120 to operate at high voltages, in particular approximately equal to 10 V.

Figure 6:
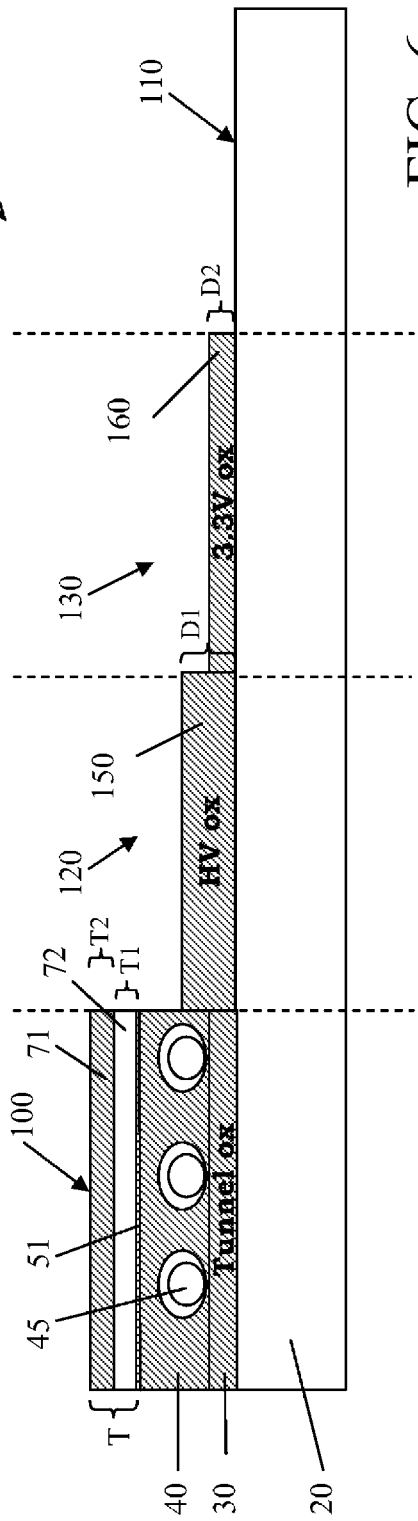

Referring to FIG. 6, moreover, the fifth oxidizing step provides a first sub-step suitable for forming a first submicron gate oxide 160 for the second transistor 130. The second transistor 130 has a second gate oxide 160 with a second thickness D2 lower than the first thickness D1 to allow the second transistor 130 to operate at mean intensity voltages of, for example, approximately equal to 3.3 V.

Referring to FIG. 7, finally, the fifth oxidizing step provides a second sub-step suitable for forming a second submicron gate oxide 170 for the third transistor 140.

In the present embodiment, the third transistor 140 is of the low-voltage type and the third oxide 170 has a third thickness D3 less than the first and the second thickness, D1 and D2 to allow the third transistor 140 to operate at low intensity voltages, such as approximately equal to 1.2 V.

According to an embodiment of the semiconductor device 200, the thicknesses of the gate oxides may have different dimensions according to the respective CMOS transistors.

It is noted that during the fifth oxidizing step, the nitride layer 52 suitably protects the nanocrystals 45 present in the nanocrystal layer 40 to preserve, in particular, their dimensions and arrangements. In this way, the nitride layer 52 functions as a barrier or protective layer for the nanocrystals 45.

Adequate dimensioning of the initial thickness T of the nitride layer 52 and adequate use of the oxidizing techniques for forming the gate oxides in the circuitry area 110 allow obtaining, at the end of the fifth oxidizing step, an oxide layer 70 above the nanocrystal layer 40.

During the fifth oxidizing step, the nitride layer 52 is completely converted into the oxide layer 70.

Referring again to FIG. 7, at the end of the fifth oxidizing step, the circuitry area 110 does not include nitride layers since the same are completely transformed into oxide.

According to the present embodiment, the preliminary sub-step comprises an oxidizing phase that provides prolonged thermal treatments in an oven, suitable for growing in the circuitry area 110, by using also a suitable mask, the preliminary gate oxide 150, having a predetermined thickness, in particular equal to the first thickness D1 and having, in particular a relatively greater thickness than the second and the third thickness, D2 and D3.

The oxidizing phase involves thermal treatments with the use of ovens of the known type.

During the preliminary sub-step, i.e. during this oxidizing phase, the nitride layer 52 remains substantially un-affected.

Moreover, during the preliminary sub-step of the fifth oxidizing step, the nitride layer 52 functions as a protection barrier for the underlying nanocrystal layer 40. In this way the nanocrystals 45 remain un-damaged both in their arrangement and in their thickness. Thus, the nitride layer 52 defines a protective layer for the nanocrystals 45.

The first sub-step and the second sub-step of the process according to the present embodiment provide the use of techniques, such as ISSG, which allow forming high-quality submicron oxides with accurately controlled thicknesses for obtaining submicron CMOS transistors.

During the first and second sub-steps of the fifth oxidizing step, the nitride layer 52 is also oxidized. Referring again to FIG. 6, at the end of the first sub-step, once the first gate oxide 160 has been obtained, a partial transformation of the nitride layer 52 into a first portion 71 of oxide occurs.

According to the present embodiment, further to the first sub-step of the fifth oxidizing step, the nitride layer 52 comprises the first portion 71 transformed into oxide, which has a first thickness T1, and a second portion 72 of nitride, which has a second thickness T2. In particular, the first thickness T1 and the second thickness T2 have a value that is function of the thickness of the first submicron gate oxide 160, of the technique, and of the time used for obtaining this submicron oxide.

During the first sub-step of the fifth oxidizing step, the nitride layer 52 defines for the nanocrystals 45 a barrier layer safeguarding the nanocrystals 45 from possible unsuitable modifications further to the thermal treatments used.

Also during the first sub-step of the fifth oxidizing step, the nanocrystals 45 remain unchanged, both as regards their arrangement inside the nanocrystal layer 40 and as regards their dimensions.

According to the present embodiment, during the second sub-step of the fifth oxidizing step, in particular by using techniques such as the ISSG technique for forming the third oxide layer 170, the second portion 72 of nitride is completely transformed into oxide.

Suitably then, according to the present embodiment, the nitride layer 52 of initial thickness T is completely transformed at the end of the second sub-step of the fifth oxidizing step into an oxide layer 70.

In this way, at the end of the fifth step, the memory area 105 so-formed does not include any nitride layer, which is completely transformed into an oxide layer 70.

During this second sub-step, the nanocrystals 45 are suitably sheltered by the nitride layer and, in particular, by the second portion 72 of nitride, at least until the nitride layer 52 is completely transformed into the oxide layer 70.

It is worth noting that the oxide layer 70 so-formed may have a final thickness S that is different from the initial thickness T of the nitride layer 52 originally formed.

According to the present embodiment, due to the controlled deposition step, the nitride layer 52 has a suitable initial thickness T dimensioned in such a way that, according to the treatments used and to the thicknesses of gate oxides of the submicron CMOS transistors to be obtained, at the end of the fifth oxidizing step the whole nitride layer 52 is transformed, i.e. converted, into an oxide layer 70.

Referring to FIG. 8, at this point it is possible to continue the process with the usual steps which provide a sixth step suitable for adequately defining a second polysilicon layer to form the control gates of the memory cell and of the CMOS transistors, as well as a seventh step suitable for adequately separating and defining at least one memory cell 100 in the memory area 105 as well as single CMOS transistors in the circuitry area 110, according to the design specifications, in particular forming the control gate of the memory cell, indicated with 60, and of the CMOS transistors, indicated with 60A, 60B and 60C.

In case the design specifications for the semiconductor device involve control circuitry comprising a different number of CMOS transistors, by means of the controlled deposition step it is possible to execute a suitable balance of the initial thickness T of the nitride layer 52, to provide a complete transformation of the nitride layer 52 into the oxide layer 70 at the end of the fifth oxidizing step.

In particular, according to an embodiment of the present invention, the fifth oxidizing step comprises at least one final sub-step carried out by using suitable technology (e.g., ISSG) that allows the formation of a submicron gate oxide of a respective submicron CMOS transistor, and simultaneously allows transforming a nitride layer 52 present in the nanocrystal memory cells into an oxide layer 70.

An advantage of one or more embodiments of the present invention is that of obtaining a simple and excellent process for fabricating reliable and precise nanocrystal memory devices by integrating nanocrystal memory cells with submicron CMOS transistors.

Another advantage of one or more embodiments of the present invention is that by calibrating the initial thickness T of the nitride layer 52 present in the nanocrystal memory area it is possible to safeguard the dimensions and the density of the nanocrystals 45 from the thermal treatments during the oxidizing steps, in particular of the ISSG type, for the formation of the gate oxides of the CMOS transistors in the circuitry area.

A further advantage of one or more embodiments of the present invention is linked to the fact that the process does not require additional steps with respect to the known processes.

Another embodiment of the present invention relates to a system. The memory device 200 shown in FIG. 8 may be part of an integrated circuit, which may be part of an electronic system, such as a computer system. For example, the integrated circuit including the memory device 200 may be configured as a memory circuit and may be coupled to a controller to form part of a computer system.

While various aspects and embodiments of the invention have been disclosed herein, other aspects and embodiments are contemplated. The various aspects and embodiments disclosed herein are for purposes of illustration and are not intended to be limiting.

The invention claimed is:

1. A method for the formation of a memory device integrated on a semiconductor substrate and comprising at least one nanocrystal memory and CMOS transistors, the method comprising:
    a first step suitable for forming, above said substrate, a first dielectric layer;
    a second step suitable for forming, above said first dielectric layer, a nanocrystal layer comprising a plurality of nanocrystals;
    a third step suitable for forming, above said nanocrystal layer, a second dielectric layer;
    a fourth masking and etching step suitable for removing said second dielectric layer, said nanocrystal layer and said first dielectric layer to define on said substrate a nanocrystal memory area and a circuitry area; and
    a fifth oxidizing step suitable to form on said circuitry area at least one gate oxide for at least one of said CMOS transistors; and
    wherein said third step comprises at least one controlled deposition step suitable for defining at least one nitride layer having an initial thickness, said initial thickness being such as to allow a complete transformation of said nitride layer into an oxide layer at the end of said fifth oxidizing step to form said second dielectric layer.

2. The method according to claim 1 wherein said fifth oxidizing step comprises at least one first sub-step suitable for forming in said circuitry area at least one first submicron gate oxide and that after at least one first sub-step said nitride layer shows at least one first portion transformed into oxide.

3. The method according to claim 2 wherein said fifth oxidizing step comprises a second sub-step suitable for forming in said circuitry area a second submicron gate oxide and that after said second sub-step said nitride layer is completely transformed into said oxide layer.

4. The method according to claim 3 wherein said fifth oxidizing step comprises at least one preliminary sub-step suitable for forming in said circuitry area a preliminary gate oxide and that after said at least one preliminary sub-step said nitride layer shows said initial thickness.

5. The method according to claim 1 wherein said third step comprises, prior to said at least one controlled deposition step, a deposition step of a thin oxide layer.

6. The method according to claim 1 wherein said first step comprises a growth step of an oxide layer to define said first dielectric layer.

7. The process according to any claim 1 wherein said first step comprises a deposition step of an oxide layer to define said first dielectric layer.

8. The method according to claim 1 wherein said second step comprises a growth step in oven of said nanocrystal layer.

9. The method according to claim 1 wherein said second step comprises an epitaxial growth step for the formation of said nanocrystal layer.

10. The method according to claim 1 wherein said second step comprises a deposition step of said nanocrystal layer.

11. The method according to claim 1 wherein said controlled deposition step of said third step forms a second dielectric layer having an initial thickness which is function of the thickness of said gate oxides of said transistors CMOS in said circuitry area.

12. The method according to claim 1 wherein said fifth oxidizing step forms at least one submicron gate oxide by using an ISSG technique and in that said initial thickness of said nitride layer is function of said submicron gate oxide.

13. The method according to claim 1 wherein said fifth oxidizing step, said first sub-step uses an ISSG technique.

14. The method according to claim 1 wherein said fifth oxidizing step, said second sub-step uses an ISSG technique.

15. The method according to claim 1, further comprising a sixth step suitable for adequately defining a second polysilicon layer for forming the control gates of said at least one memory cell and of said CMOS transistors, as well as a seventh step suitable for adequately separating and defining said at least one memory cell in said memory area as well as said single CMOS transistors in said circuitry area , in particular forming respective control gates.

16. A method of fabricating a memory device, comprising:
forming a nanocrystal layer including a plurality of nanocrystals therein over a semiconductor substrate;
forming a protective layer over the nanocrystal layer;
removing a portion of the nanocrystal layer and the protective layer to form a memory-cell region and a transistor region; and
forming respective transistor-gate oxides over the semiconductor substrate without substantially damaging the nanocrystals of the nanocrystal layer.

17. The method of claim 16 wherein forming a nanocrystal layer including a plurality of nanocrystals therein over a semiconductor substrate comprises epitaxially growing the nanocrystals.

18. The method of claim 16 wherein forming a nanocrystal layer including a plurality of nanocrystals therein over a semiconductor substrate comprises depositing the nanocrystals.

19. The method of claim 16 wherein forming a protective layer over the nanocrystal layer comprises forming a nitride layer over the nanocrystal layer.

20. The method of claim 16 wherein forming a protective layer over the nanocrystal layer comprises forming the protective layer with a thickness that is related to a thickness of each of the respective transistor-gate oxides.

21. The method of claim 16 wherein:
forming respective transistor-gate oxides semiconductor substrate without substantially damaging the nanocrystals of the nanocrystal layer comprises growing the respective transistor-gate oxides using an oxidation process; and
forming a protective layer over the nanocrystal layer comprises forming the protective layer with a thickness that is at least a function of a thickness of each of the respective transistor-gate oxides and the oxidation process.

22. The method of claim 16, further comprising:
wherein forming respective transistor-gate oxides semiconductor substrate without substantially damaging the nanocrystals of the nanocrystal layer comprises growing the respective transistor-gate oxides; and
converting substantially all of the protective layer from a nitride layer to an oxide layer during the act of growing the respective transistor-gate oxides.

23. The method of claim 22 wherein growing the respective transistor-gate oxides comprises subjecting the transistor region of the semiconductor substrate to a thermal oxidation growth process.

24. The method of claim 16 wherein forming respective transistor-gate oxides semiconductor substrate without substantially damaging the nanocrystals of the nanocrystal layer comprises sequentially growing the respective transistor-gate oxides from thickest to thinnest.

25. The method of claim 16, further comprising:
wherein forming respective transistor-gate oxides semiconductor substrate without substantially damaging the nanocrystals of the nanocrystal layer comprises sequentially growing the respective transistor-gate oxides; and
converting substantially all of the protective layer from a nitride layer to an oxide layer after completing the act of sequentially growing the respective transistor-gate oxides.

26. The method of claim 16 wherein forming respective transistor-gate oxides semiconductor substrate without substantially damaging the nanocrystals of the nanocrystal layer comprises forming the respective transistor-gate oxides without substantially altering at least one of a size and an arrangement of the plurality of nanocrystals present in the nanocrystal layer.

27. The method of claim 16 wherein removing a portion of the nanocrystal layer and the protective layer to form a memory region and a transistor region comprises etching the portion of the nanocrystal layer and the protective layer.

28. The method of claim 16 wherein each transistor-gate oxide forms part of a respective CMOS transistor.

29. The memory device of claim 28 wherein the oxide layer of the barrier has a thickness that is related, at least in part, to a thickness of the respective gate oxides of the plurality of transistors.

30. The memory device of claim 28 wherein the oxide layer of the barrier is formed by oxidizing a nitride layer.

31. A memory device, comprising:
a plurality of transistors each having a respective gate and a respective gate oxide; and
a memory cell formed adjacent to the plurality of transistors, the memory cell including:
a nanocrystal layer having a plurality of nanocrystals therein;
a barrier formed over the nanocrystal layer, the barrier consisting of substantially only an oxide layer and being substantially free of a nitride layer; and
a control gate formed over the barrier.

32. The memory device of claim 31 wherein each transistor comprises a CMOS transistor in which the respective gate oxide thereof has a thickness than the other respective gate oxides.

33. The memory device of claim 31 wherein the memory cell comprises a tunnelling oxide layer formed between the nanocrystal layer and a semiconductor substrate.

34. The memory device of claim 31 wherein a functionality of the plurality of nanocrystals is not substantially degraded as a result of forming the gate oxides of the plurality of transistors.

35. A memory device, comprising:
a plurality of transistors each having a respective gate and a respective gate oxide: and
a memory cell formed adjacent to the plurality of transistors, the memory cell including:
a nanocrystal layer having a plurality of nanocrystals therein;
a barrier formed over the nanocrystal layer, the barrier comprising substantially only an oxide layer and being substantially free of a nitride layer; and
a control gate formed over the barrier;
wherein the memory cell comprises an oxide layer disposed between the barrier and the nanocrystal layer, and being relatively thin compared to the barrier.

36. A system, comprising:
a controller; and
a memory device coupled to the controller, the memory device including:

a plurality of transistors each having a respective gate and a respective gate oxide; and a memory cell formed adjacent to the plurality of transistors, the memory cell including:

a nanocrystal layer having a plurality of nanocrystals therein;

a barrier formed over the nanocrystal layer, the barrier consisting of substantially only an oxide layer and being substantially free of a nitride layer; and a control gate formed over the barrier.

* * * * *